United States Patent
Bardeen et al.

(10) Patent No.: US 10,386,697 B2
(45) Date of Patent: Aug. 20, 2019

(54) HYBRID MOLECULE-NANOCRYSTAL PHOTON UPCONVERSION ACROSS THE VISIBLE AND NEAR-INFRARED

(71) Applicant: THE REGENTS OF THE UNIVERSITY OF CALIFORNIA, Oakland, CA (US)

(72) Inventors: Christopher John Bardeen, Riverside, CA (US); Ming Lee Tang, Riverside, CA (US); Kerry Miller Hanson, Riverside, CA (US); Zhiyuan Huang, Riverside, CA (US); Xin Li, Riverside, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 15/740,097

(22) PCT Filed: Jul. 5, 2016

(86) PCT No.: PCT/US2016/040960
§ 371 (c)(1),
(2) Date: Dec. 27, 2017

(87) PCT Pub. No.: WO2017/058326
PCT Pub. Date: Apr. 6, 2017

(65) Prior Publication Data
US 2018/0314132 A1 Nov. 1, 2018

Related U.S. Application Data

(60) Provisional application No. 62/188,366, filed on Jul. 2, 2015.

(51) Int. Cl.
*G02F 2/02* (2006.01)
*C09K 11/06* (2006.01)
(Continued)

(52) U.S. Cl.
CPC ............... *G02F 2/02* (2013.01); *C09K 11/06* (2013.01); *C09K 11/881* (2013.01);
(Continued)

(58) Field of Classification Search
CPC ........................ G02F 1/3526; G02F 2202/36
(Continued)

(56) References Cited

U.S. PATENT DOCUMENTS

2004/0067431 A1 4/2004 Arney et al.
2005/0056815 A1 3/2005 Miteva et al.
(Continued)

FOREIGN PATENT DOCUMENTS

EP 3 183 579 A0 6/2017
WO WO 2014/117203 A1 8/2014
(Continued)

OTHER PUBLICATIONS

International Search Report (PCT/ISA/210) dated Mar. 24, 2017, by the United States Patent and Trademark Office as the International Searching Authority for International Application No. PCT/US2016/040960.
(Continued)

*Primary Examiner* — Rhonda S Peace
(74) *Attorney, Agent, or Firm* — Buchanan Ingersoll & Rooney

(57) ABSTRACT

The ability to upconvert two low energy photons into one high energy photon has potential applications in solar cells, photodetectors and data storage. In this disclosure, CdSe and PbSe semiconductor nanocrystals are combined with molecular emitters (diphenylanthracene and rubrene) to upconvert photons in both the visible and near infrared spectral regions. Absorption of low energy photons by the nanocrystals is followed by energy transfer to the molecular triplet states, which then undergo triplet-triplet annihilation
(Continued)

to create high energy singlet states that emit upconverted light. By using conjugated organic ligands on the nanocrystals to form an energy cascade, the upconversion process can be enhanced by up to three orders of magnitude. The use of different combinations of nanocrystals and emitters shows that this platform has great flexibility in the choice of both excitation and emission wavelengths.

19 Claims, 12 Drawing Sheets

(51) Int. Cl.
C09K 11/88 (2006.01)
H01L 51/44 (2006.01)
H01L 31/055 (2014.01)
B82Y 20/00 (2011.01)

(52) U.S. Cl.
CPC .......... C09K 11/883 (2013.01); H01L 31/055 (2013.01); H01L 51/447 (2013.01); B82Y 20/00 (2013.01); Y02E 10/52 (2013.01); Y02E 10/549 (2013.01)

(58) Field of Classification Search
USPC ........................................................ 359/326
See application file for complete search history.

(56) References Cited

U.S. PATENT DOCUMENTS

| | | | |
|---|---|---|---|
| 2009/0251765 A1* | 10/2009 | Miteva | C09K 11/06 359/326 |
| 2010/0103504 A1* | 4/2010 | Lawandy | G02F 2/02 359/326 |
| 2011/0049442 A1 | 3/2011 | Schreuder et al. | |
| 2013/0070443 A1 | 3/2013 | Pan et al. | |
| 2014/0071517 A1 | 3/2014 | Schut et al. | |
| 2014/0261031 A1 | 9/2014 | Kellar et al. | |
| 2014/0312302 A1 | 10/2014 | Oron et al. | |
| 2015/0076469 A1 | 3/2015 | Ikemizu et al. | |
| 2015/0162476 A1 | 6/2015 | Doty et al. | |
| 2018/0258111 A1* | 9/2018 | Tang | C07F 7/24 |
| 2018/0314132 A1* | 11/2018 | Bardeen | C09K 11/881 |

FOREIGN PATENT DOCUMENTS

| | | |
|---|---|---|
| WO | 2016/028855 A1 | 2/2016 |
| WO | 2016/133872 A1 | 8/2016 |

OTHER PUBLICATIONS

Written Opinion (PCT/ISA/237) dated Mar. 24, 2017, by the United States Patent and Trademark Office as the International Searching Authority for International Application No. PCT/US2016/040960.
Shockley et al., "Detailed balance limit of efficiency of p-n junction solar cells", J. Appl. Phys., Mar. 1961, pp. 510-519, vol. 32, No. 3, American Institute of Physics.
Trupke et al., "Improving solar cell efficiencies by up-conversion of sub-band-gap light", J. Appl. Phys., Oct. 1, 2002, pp. 4117-4122, vol. 92, No. 7, American Institute of Physics.
Shpaisman et al., "Can up- and down-conversion and multi-exciton generation improve photovoltaics?", Sol. En. Mater. Sol. Cells, 2008, pp. 1541-1546, vol. 92, Elsevier B.V.
Nozik et al., "Semiconductor Quantum Dots and Quantum Dot Arrays and Applications of Multiple Exciton Generation to Third-Generation Photovoltaic Solar Cells", Chem. Rev. 2010, pp. 6873-6890, vol. 110, No. 11, American Chemical Society.
Kozlov et al., "Anti-Stokes delayed fluorescence from metal-organic bichromophores", Chem. Commun., 2004 pp. 2860-2861, The Royal Society of Chemistry.
Baluschev et al., "Up-conversion fluorescence: noncoherent excitation by sunlight", Phys. Rev. Lett., Oct. 6, 2006, pp. 143903/143901-143903/143903, vol. 97, The American Physical Society.
Hoseinkhani et al., "Achieving the photon up-conversion thermodynamic yield upper limit by sensitized triplet-triplet annihilation", Phys. Chem. Chem. Phys., 2015, pp. 4020-4024, vol. 17, The Owner Societies.
Singh-Rachford et al,. "Supermolecular-Chromophore-Sensitized Near-Infrared-to-Visible Photon Upconversion", J. Am. Chem. Soc., 2010, pp. 4203-14211, vol. 132, American Chemical Society.
Yakutkin et al., "Towards the IR Limit of the Triplet-Triplet Annihilation-Supported Up-Conversion: Tetraanthraporphyrin", Chem-Eu. J., 2008, pp. 9846-9850, vol. 14, Wiley-VCH Verlag GmBH & Co. KGaA, Weinheim.
Zhou et al. "Upconversion Luminescent Materials: Advances and Applications", Chem. Rev., 2015, pp. 395-465, vol. 115, American Chemical Society.
Wu et al., "Plasmon-Enhanced Upconversion", J. Phys. Chem. Lett., 2014, pp. 4020-4031, vol. 5, American Chemical Society.
Khetubol et al., "Ligand exchange leads to efficient triplet energy transfer to CdSe/ZnS Q-dots in a poly(N-vinylcarbazole) matrix nanocomposite", J. Appl. Phys., 2013, pp. 083507-083501/083507-083511, vol. 113, American Institute of Physics.
Tabachnyk et al., "Resonant energy transfer of triplet excitons from pentacene to PbSe nanocrystals", Nat. Mater., Nov. 2014, pp. 1033-1038, vol. 13, Macmillan Publishers Limited.
Thompson et al., "Energy harvesting of non-emissive triplet excitons in tetracene by emissive PbS nanocrystals", Nat. Mater., Nov. 2014, pp. 1039-1043, vol. 13, Macmillan Publishers Limited.
Samia et al., "Semiconductor quantum dots for photodynamic therapy", J. Am. Chem. Soc., 2003, pp. 15736-15737, vol. 125, American Chemical Society.
Cossairt et al., "Tuning the Surface Structure and Optical Properties of CdSe Clusters Using Coordination Chemistry", J. Phys. Chem. Lett., 2011, pp. 3075-3080, vol. 2, American Chemical Society.
Schmidt et al., "Photochemical upconversion: the primacy of kinetics", J. Phys. Chem. Lett., 2014, pp. 4062-4072. vol. 5, American Chemical Society.
Moreels et al., "Composition and size-dependent extinction coefficient of colloidal PbSe quantum dots", Chem. Mater., 2007, pp. 6101-6106, vol. 19, No. 25, American Chemical Society.
Moreels et al., "Size-Dependent Optical Properties of Colloidal PbS Quantum Dots", Acs Nano, 2009, pp. 3023-3030, vol. 3, No. 10, American Chemical Society.
Yu et al., "Experimental determination of the extinction coefficient of CdTe, CdSe, and CdS nanocrystals", Chem. Mater., 2003, pp. 2854-2860, vol. 15, No. 14, American Chemical Society.
Haefele et al., "Getting to the (square) root of the problem: how to make noncoherent pumped upconversion linear", J. Phys. Chem. Lett., 2012, pp. 299-303, vol. 3, American Chemical Society.
Boyer et al., "Absolute quantum yield measurements of colloidal NaYF4: Er3+, Yb3+ upconverting nanoparticles", Nanoscale, 2010, pp. 1417-1419, vol. 2, The Royal Society of Chemistry.
Wehrenberg et al., "Interband and intraband optical studies of PbSe colloidal quantum dots", J. Phys. Chem. B, 2002, pp. 10634-10640, vol. 106, American Chemical Society.
Burgdorff et al., "Photophysical properties of tetracene derivatives in solution", Spectrochim Acta, 1988, pp. 1137-1141, vol. 44A, Nol. 11, Pergamon Press plc.
Nirmal et al., "Observation of the dark exciton in CdSe quantum dots", Phys. Rev. Lett., Nov. 13, 1995, pp. 3728-3731, vol. 75, No. 20, The American Physical Society.
Efros et al., "Band-edge exciton in quantum dots of semiconductors with a degenerate valence band: Dark and bright exciton states", Phys. Rev. B, Aug. 15, 1996, pp. 4843-4856, vol. 54, No. 7, The American Physical Society.
Kang et al., "Electronic structure and optical properties of PbS and PbSe quantum dots", J. Opt. Soc. Am. B-Opt. Phys., Jul. 1997, pp. 1632-1646, vol. 14, No. 7, Optical Society of America.
Talapin et al., "PbSe nanocrystal solids for n- and p-channel thin film field-effect transistors", Science, Oct. 7, 2015, pp. 86-89, vol. 310.

(56) References Cited

OTHER PUBLICATIONS

Semonin et al., "Peak External Photocurrent Quantum Efficiency Exceeding 100% via MEG in a Quantum Dot Solar Cell", Science, Dec. 16, 2011, pp. 1530-1533, vol. 334.
Choi et al., "Bandlike Transport in Strongly Coupled and Doped Quantum Dot Solids: A Route to High-Performance Thin-Film Electronics", Nano Lett., 2012, pp. 2631-2638, vol. 12, American Chemical Society.
Kowet et al., "Diffusion of aromatic hydrocarbons in n-alkanes and cyclohexanes", J. Phys. Chem. A, 2001, pp. 12332-11237, vol. 105, American Chemical Society.
Carbone et al., "Synthesis and micrometer-scale assembly of colloidal CdSe/CdS nanorods prepared by a seeded growth approach", Nano Lett., 2007, pp. 2942-2950, vol. 7, No. 10, American Chemical Society.
Lechner et al., "Crystal Phase Transitions in the Shell of PbS/CdS Core/Shell Nanocrystals Influences Photoluminescence Intensity", Chem. Mater., 2014, pp. 5914-5922, vol. 26, American Chemical Society.
Extended European Search Report dated Mar. 6, 2019, by the European Patent Office in corresponding European Patent Application No. 16852230.8-1105. (7 pages).

\* cited by examiner

HYBRID MOLECULE-NANOCRYSTAL PHOTON UPCONVERSION ACROSS THE VISIBLE AND NEAR-INFRARED

GOVERNMENT RIGHTS

This invention was made with government support under grant number CHE-1152677 (CJB) awarded by the National Science Foundation, and grant number W911NF-14-1-0260 (MLT) from the US Army. The government has certain rights in the invention.

FIELD OF THE INVENTION

The present invention relates to a hybrid molecule-nanocrystal photon upconversion across the visible and near-infrared spectral region.

BACKGROUND

Extending the collection efficiency of near-infrared (NIR) photons in low-cost, earth abundant semiconductors is an ongoing challenge. For example, silicon (bandgap, $E_g$=1.1 eV) and cadmium telluride ($E_g$=1.5 eV), are unable to collect infrared photons that have wavelengths exceeding 1100 and 800 nm respectively. This limitation impacts solar energy conversion, since single junction photovoltaic cells based on these materials are subject to the Shockley-Queisser limit on their efficiencies. A scientific challenge for "Third Generation" photovoltaic technologies is to extract useful energy from all solar wavelengths and surpass the Shockley-Queisser efficiency limit.

In upconversion, two lower energy photons can be combined into a single higher energy photon that lies above the semiconductor bandgap and can be absorbed by the solar cell. This process can lead to substantial gains in overall solar conversion efficiency, for example, from 32% under the Shockley-Queisser limit to 43% under one sun for photovoltaic cells with a bandgap of 1.76 eV. The upconversion process has been realized in organic systems, in which a sensitizer absorbs a long wavelength photon, undergoes intersystem crossing to its triplet state, and then transfers its energy to the triplet state of a second molecule that acts as an emitter. When this happens twice, triplet-triplet annihilation (TTA) can occur, with two triplets fusing into a higher energy singlet state on the emitter. Organic upconversion systems can harvest photons out to 790 nm with demonstrated efficiencies, for example, approximately 1% in the NIR. Unfortunately, it has proved challenging to find photostable, long-lived organic NIR chromophores that will allow organic upconversion systems to boost the efficiency of commercially relevant photovoltaic materials like Si or CdTe. Rare earth glasses have also been used for upconversion, but they have limited spectral coverage and low efficiencies due to the forbidden nature of the optical transitions in lanthanides employed for upconversion. In order to impact current solar energy technologies, a challenge is to extend upconversion materials into the NIR spectral region.

Inorganic nanocrystals (NCs) are relatively photostable chromophores whose bandgap absorption spectra can be tuned from the near ultraviolet to the infrared. Previous reports of triplet energy transfer from organics to semiconductors suggest that it is possible for NC excitons state to exchange energy with molecular triplet states. A good example is the recent demonstration that triplet excitons produced by singlet fission in pentacene and tetracene layers can efficiently transfer their energy to adjacent semiconductor NC layers. Evidence for the reverse process, for example, energy transfer from the NC to the triplet state of an organic molecule, is scarce. Earlier experiments have provided some evidence for this transfer is possible, showing that NCs could sensitize singlet oxygen and that the low-lying triplet state of a naphthyl ligand could act as a trap state for CdSe NCs.

In accordance with an exemplary embodiment, the disclosure demonstrates that NC-organic triplet sensitization is a robust phenomenon that can be optimized through ligand chemistry. In addition, NC-organic triplet sensitization can be used to upconvert photons across the visible and infrared spectral regions. Applications of upconversion materials can include multiphoton imaging, data storage, optical displays, and lighting. This invention also has the potential to extend upconversion into the infrared spectral region, where it could be used to enhance the efficiency of commercially viable photovoltaic materials like CdTe and Si.

SUMMARY

A method is disclosed of upconverting two low energy photons into one high energy photon, the method comprising: synthesizing semiconductor nanocrystals; and combining the as-synthesized semiconductor nanocrystals with molecular emitters to upconvert photons in both visible and near infrared spectral regions.

DETAILED DESCRIPTION

Figure 1:
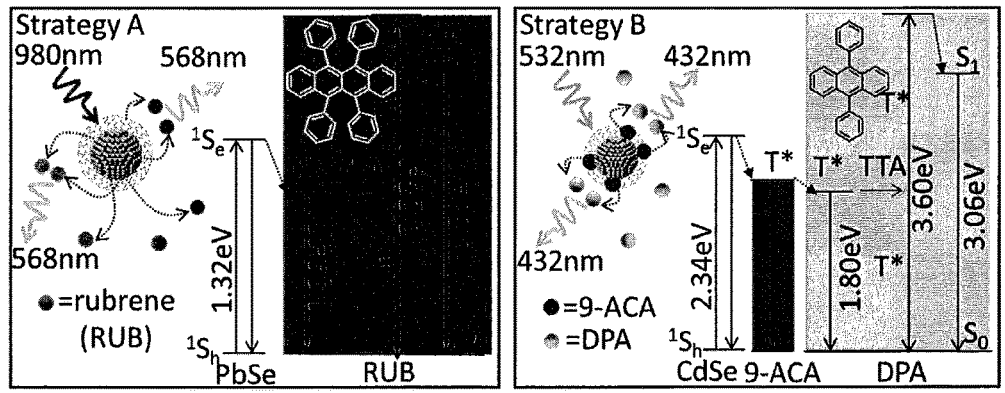
FIG. 1 shows a schematic illustration of NC-organic upconversion strategies, wherein in Strategy A, the organic ligands of the PbSe NC are electronically inert and energy must be transferred directly to the triplet state of the organic emitter rubrene (RUB), and in Strategy B, the energy is first transferred to the triplet state of an anthracene-based ligand, 9-anthracene carboxylic acid (9-ACA), which then transfers it to the diphenylanthracene (DPA) emitter.

In accordance with an exemplary embodiment, the general idea of upconversion includes using nanocrystal (NC) sensitizers as outlined in FIG. 1. In accordance with an exemplary embodiment, two potential strategies are illustrated. In Strategy A, the as-synthesized NC is surrounded by the native alkyl-terminated carboxylic acid or phosphonic acid ligands. Since these ligands do not have low-lying triplet states, energy transfer must occur directly from the NC to the emitter in solution. Given that triplet-triplet energy transfer is generally believed to require wavefunction overlap between acceptor and donor and operates on short (approximately 1 Å) length scales, it is not clear that Strategy A could be successful with ligands that typically have alkyl chain lengths on the order of 10 Å or more. In Strategy B, the ligand itself has a triplet state that can accept the energy from the NC exciton. The triplet state on the ligand acts as a transmitter that mediates triplet energy transfer from the NC sensitizer to an emitter in solution. In accordance with an exemplary embodiment, this strategy relies on an energy transfer cascade to move energy from the NC to the emitter. In this disclosure, both strategies will be disclosed, and wherein Strategy B with the energy cascade has shown superior upconversion efficiencies.

Figure 2:
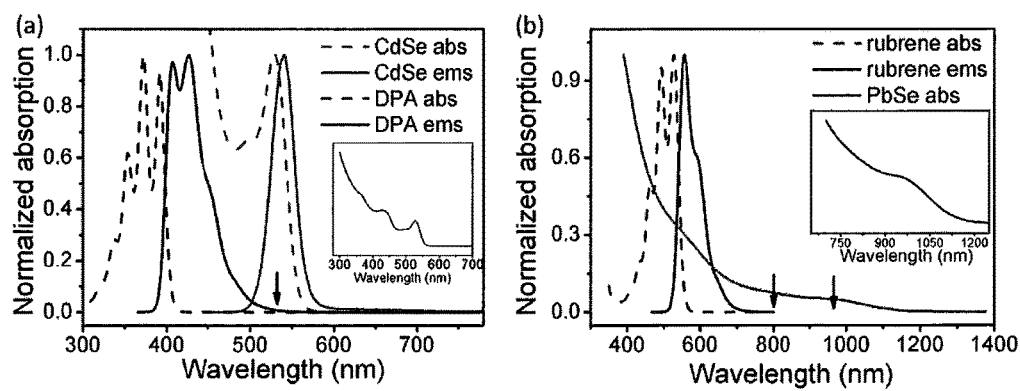
FIG. 2 shows a) an absorption and emission spectra of 3.3 nm CdSe/DPA sensitizer/emitter pair in hexane at room temperature. Inset is the full absorption spectrum of CdSe, b) an absorption and emission spectra of 2.1 nm PbSe/RUB sensitizer/emitter pair taken in toluene at room temperature. Inset is the absorption of PbSe's first exciton, wherein arrows indicate excitation wavelengths for photon upconversion.

As emitter molecules, diphenylanthracene (DPA) and rubrene (RUB) were used. Both are commonly used in organic-organic upconversion schemes due to their long-lived, low-lying triplet states and high (>97%) singlet state fluorescence quantum yields. As sensitizers, CdSe in combination with DPA was used to upconvert visible (532 nm) light to the blue region (DPA's emission peaks at ~450 nm) and PbSe in combination with RUB to upconvert the NIR (800-980 nm) to the visible (RUB's emission peaks at ~550 nm). The absorption and fluorescence spectra of both the NC sensitizers and the organic emitters are shown in FIG. 2, along with the laser wavelengths used in the upconversion experiments described below. Details regarding NC synthesis, ligand exchange and characterization by NMR, quantum efficiency measurements, etc. are also disclosed.

Figure 3:
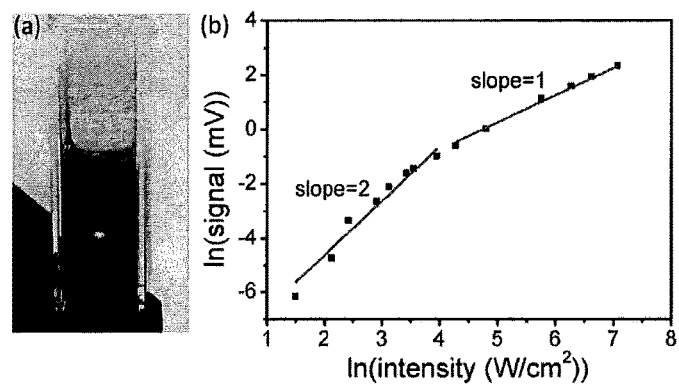
FIG. 3 shows a) photograph of upconversion in a cuvette containing the 2.1 nm PbSe/RUB mixture. The yellow spot is emission from the RUB originating from an unfocused cw 800 nm laser with an intensity of 1 W/cm², and b) log-log plot of upconversion signal versus laser intensity (W/cm²) for the PbSe/RUB mixture, showing the transition from quadratic (slope=2) to linear (slope=1) regimes, where (a) and (b) were conducted in dry and degassed toluene with 3.84 mM rubrene and 58.1 µM PbSe NCs at room temperature.

Since the ultimate goal is to extend the spectral response of upconversion systems into the NIR, 2.1 nm PbSe NCs capped with oleic acid ligands with RUB were first used as the emitter. These samples gave visible upconversion, as shown in FIG. 3a. A bright yellow fluorescence originates from the spot where a 3 mm diameter, 100 mW 800 nm cw laser beam hits the sample. The black color of the cuvette is due to the PbSe NCs, whose absorption extends across the entire visible spectrum. The intensity dependence of the upconverted signal, shown in FIG. 3b, exhibits the signature linear-to-quadratic behavior seen in organic upconversion systems. The absolute yield of the upconversion was determined by comparing the RUB output from the upconversion to that from direct excitation of the RUB by 400 nm light. The upconversion quantum yield was $1.0 \pm 0.5 \times 10^{-4}$ (or 0.01%) in the linear intensity regime where the efficiency is maximized (supplementary online text). When a 980 nm laser diode was used to excite the sample, yellow upconverted light was also observed. The 980 nm source was not sufficiently intense to reach the linear regime, but the efficiency at this wavelength was estimated to be within a factor of 3 of that at 800 nm (supplementary online text). In accordance with an exemplary embodiment, it is believed that 980 nm is the longest wavelength that has been upconverted using the triplet-triplet annihilation strategy. While the efficiency is lower than the 0.1% measured for nanosized NaYF$_4$:20% Yb,2% Er, irradiated at 980 nm with an intensity of 150 W/cm$^2$, we emphasize that there are still many parameters that can be optimized in this system, including the implementation of Strategy B.

Figure 4:
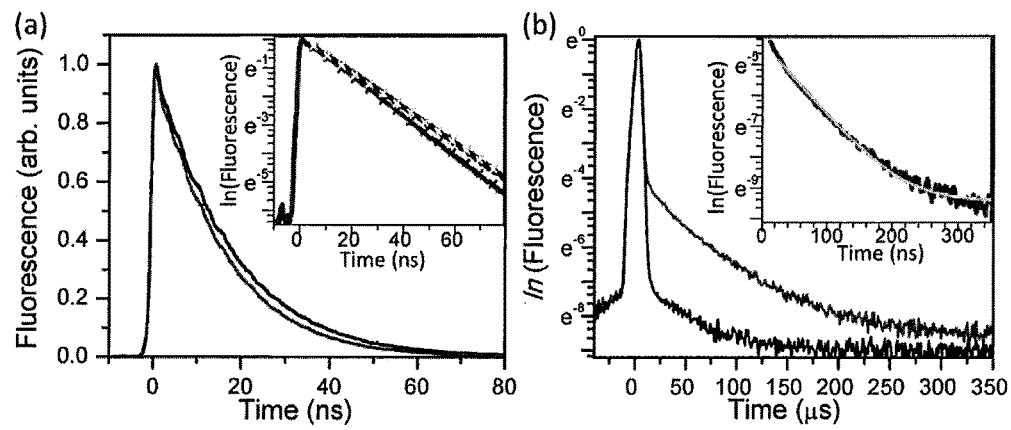
FIG. 4 shows a) prompt fluorescence decay of PbSe/RUB (red line) and RUB (black line) samples in a 100 ns time window, inset: logarithmic plot of decay along with exponential fits (crosses), and the singlet decay time decreases from 16.2 ns for RUB alone to 14.3 ns in the PbSe mixture; and b) logarithmic plot of the delayed fluorescence decay of PbSe/RUB (red) and RUB (black) samples on the microsecond timescale. The spike at time=0 is due to prompt fluorescence due to direct two-photon excitation of the RUB. Inset: logarithmic plot of delayed fluorescence component overlaid with fit with 41 microsecond decay time and a 5% offset.

The TTA mechanism of upconversion was confirmed by time-resolved fluorescence measurements on the upconversion sample. Pulsed excitation at 800 nm leads to two RUB emission components, widely separated in time. Direct two-photon excitation of the RUB by itself leads to a prompt fluorescence decay on the nanosecond timescale. This fluorescence decay in the PbSe/RUB mixture is 14.3 ns, as compared to 16.2 ns measured for RUB by itself in toluene (FIG. 4a). Despite the high concentration of PbSe NCs, there is only a slight decrease in fluorescence lifetime that corresponds to a decrease in fluorescence yield from 98% (RUB by itself) to 86% in the mixed solution. On longer timescales, there is a delayed fluorescence component that decays with a 41 microsecond (μs) time constant (FIG. 4b) that is entirely absent in the RUB-only sample. The delayed fluorescence arises from the fusion of pairs of RUB triplets formed by energy transfer from the excited PbSe NCs. If it is assumed that most of the PbSe→RUB energy transfer occurs within the approximately 1 microsecond lifetime of the luminescent exciton in PbSe, then the delayed fluorescence reflects the RUB triplet lifetime. In the limit of bimolecular triplet encounters, the delayed fluorescence lifetime is half the triplet lifetime, allowing one to estimate a RUB triplet lifetime of 82 μs in the mixed solution. In accordance with an exemplary embodiment, this lifetime is within the 120 μs lifetime reported for RUB in nonpolar liquids, indicating that quenching of the RUB triplet state is not pronounced in the mixed solution. Note that there is a small (5%) component of the delayed fluorescence that persists for much longer times, as can be seen from the fact that some upconversion signal is detectable even at 300 μs. Energy transfer from the PbSe NCs to the RUB is the dominant process in these mixed solutions, despite the fact that the PbSe sample has lower energy states that can accept energy from both RUB's singlet and triplet states.

In accordance with an exemplary embodiment, some general observations about the physical mechanism of the NC sensitization of the molecular triplet states can be made. For example, both experiment and theory have shown that quantum confinement in semiconductor NCs leads to a dark state with triplet character just below the optically allowed state. Energy transfer from this state to the molecular triplet state would be spin-allowed. The participation of long-lived dark NC exciton states can be supported by the presence of a minor (5%) long-lived component in the RUB delayed fluorescence (FIG. 4b), which suggests that some state is supplying energy to RUB long after the optically bright exciton state has decayed.

Triplet-triplet energy transfer typically occurs via a Dexter mechanism that relies on wavefunction overlap. In accordance with an exemplary embodiment, one way to enhance wavefunction overlap is to increase the extent of the excitonic wavefunction beyond the NC surface. For example, previous work on charge transport in NC arrays has shown that wavefunctions of particles with smaller effective masses can extend well beyond the NC surface. Small carrier effective masses lead to larger exciton Böhr radii. By this logic, a larger Böhr radius should lead to a larger evanescent component of the exciton wavefunction and more efficient Dexter energy transfer. As a preliminary test of this idea, PbSe (Böhr radius=46 nm) was compared to PbS (Böhr radius=18-20 nm). In accordance with an exemplary embodiment, under identical conditions (absorption at 800 nm, laser power, RUB concentration), the PbS upconversion output was consistently a factor of 3.5-3.8 times less than that of the PbSe sample. This observation lends qualitative support to the hypothesis that the Böhr radius may be important.

The low upconversion efficiency of the PbSe/RUB system provides motivation to identify strategies that can increase its efficiency by at least one order of magnitude. Strategy B provides a promising way forward, but the design and synthesis of organic ligands with triplet energy levels appropriate for PbSe is a challenging problem. In accordance with an exemplary embodiment, the CdSe/DPA combination has been used as a model system to demonstrate that Strategy B is a viable way to enhance upconversion yields by the required amount.

Figure 13:
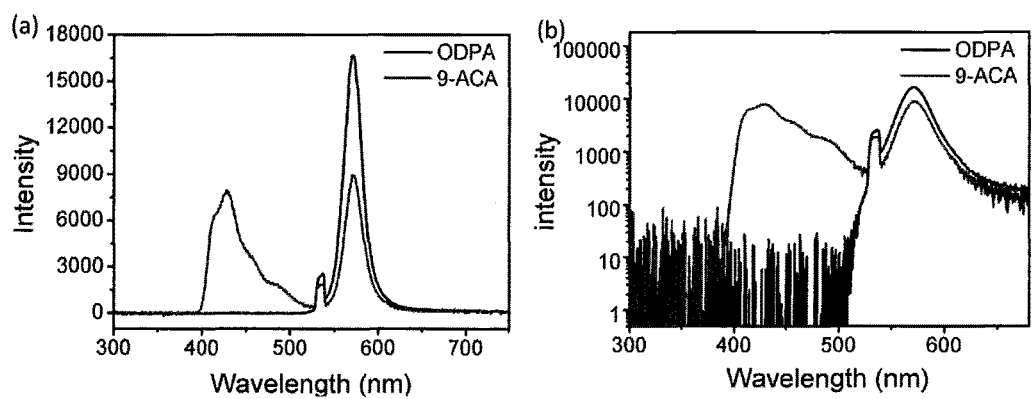
FIG. 13 shows upconversion photoluminescence spectra of CdSe/9-ACA/DPA and CdSe/ODPA/DPA samples plotted on (a) a linear scale and (b) a log scale. Samples are prepared as described in Section 2 part A, with [CdSe/9-ACA]=3.52*10$^{-6}$ M, [CdSe/ODPA]=2.10*10$^{-6}$ M, and [DPA]=1 mM.

When octadecyl phosphonic acid (ODPA) is used as the ligand for 3.3 nm diameter CdSe NCs, there was no detectable emission from DPA under 532 nm laser excitation (FIG. 13). This experiment corresponds to Strategy A in FIG. 1, and it appears that energy transfer across the ligand shell is even less efficient than in PbSe/RUB, placing an upper bound on the quantum yield of $1 \times 10^{-4}$. The arguments used above to explain the difference between PbSe and PbS also predict that CdSe (Böhr radius=4-5 nm) would show very little upconversion, as observed.

Figure 5:
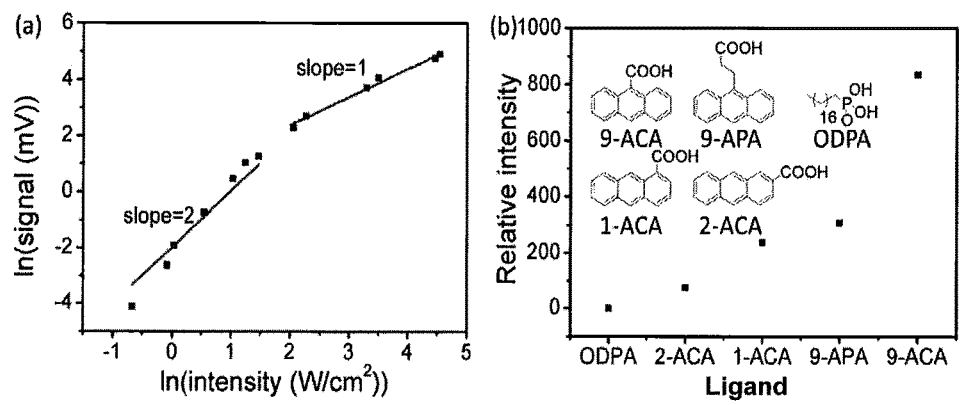
FIG. 5 shows (a) Log-log plot of upconversion versus laser intensity for the 3.3 nm CdSe/9-ACA/DPA sensitizer/ligand/emitter system, showing the transition from quadratic (slope=2) to linear (slope=1) regimes, and (b) The relative upconversion efficiency with different transmitter anthracene ligands and octadecyl phosphonic acid (ODPA) ligand attached to CdSe NCs, and wherein (a) and (b) were conducted in dry and degassed hexanes and toluene respectively with 1 mM DPA and 5 µM CdSe NCs at room temperature.
Figure 6:
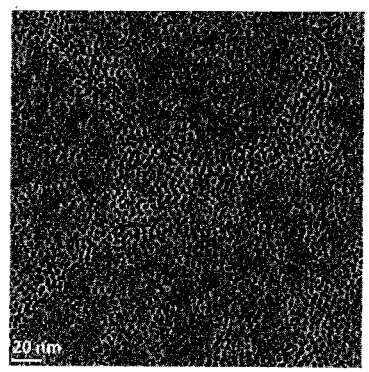
FIG. 6 shows TEM of the 3.28 nm diameter CdSe NCs used in accordance with an exemplary embodiment.
Figure 7:
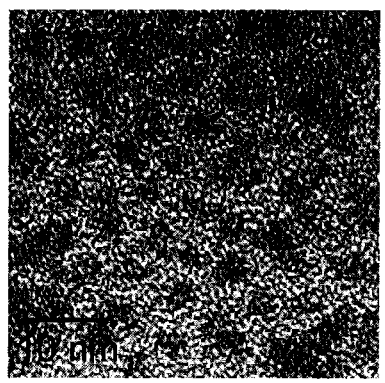
FIG. 7 shows TEM image of the 3.10 nm diameter PbS nanoparticles used in accordance with an exemplary embodiment.
Figure 8:
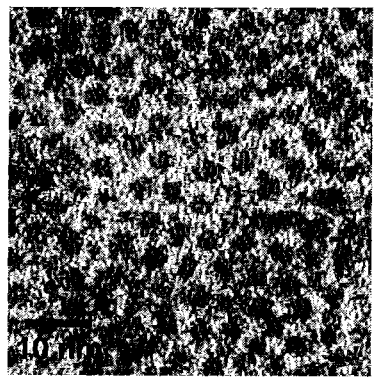
FIG. 8 shows TEM image of 2.10 nm diameter PbSe nanoparticles used in accordance with an exemplary embodiment.
Figure 19:
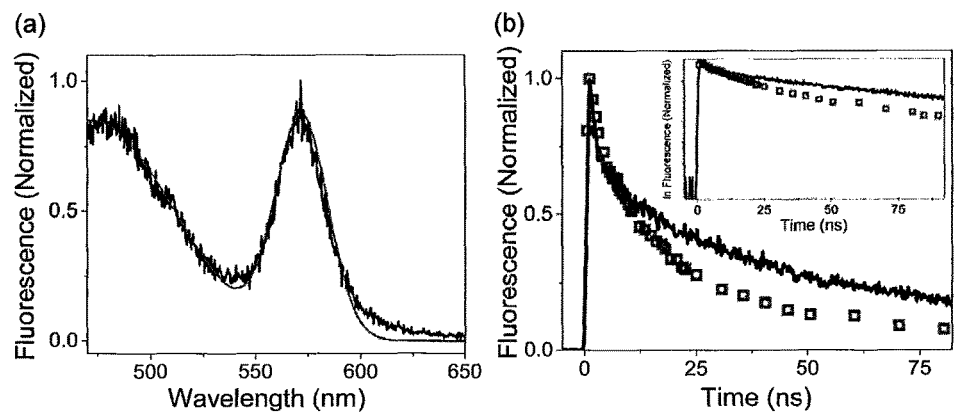
FIG. 19 shows (a) the CdSe emission peak (centered at 570 nm) with overlapping 9-ACA fluorescence (centered at 490 nm) is fit with a dual Gaussian fit (red line) in the time window 54-75 ns, the amplitude of the Gaussian centered at 570 nm is taken to be the amplitude of the CdSe luminescence in this time window, and (b) decay of CdSe/ODPA sample (black) and extracted CdSe component from CdSe/9-ACA sample (red). Inset: Logarithmic comparison of the decays. Both decays are multiexponential, as typically seen for CdSe NCs, but the CdSe/9-ACA sample diverges from the CdSe/ODPA sample after 10 ns and decays more rapidly.

To facilitate energy transfer, the ODPA ligands were replaced with anthracene derivatives functionalized with carboxylic acid groups. In accordance with an exemplary embodiment, the best performance was obtained for 9-anthracene carboxylic acid (9-ACA). The dependence of the DPA emission on laser intensity (FIG. 5a) again shows the quadratic-to-linear transition seen in organic upconversion systems. Shown in FIG. 5b is a comparison of the output levels for the five ligands tested at high power. Using Rhodamine 6G as fluorescence standard, an overall conversion efficiency of 9±2% was calculated for the 2.7 nm CdSe/9-ACA/DPA system (supplementary online text). The use of the anthracene ligands enhances the DPA emission by roughly a factor of approximately $10^3$, resulting in a blue fluorescence output that is easily visible by eye using a 532 nm laser. Time-resolved fluorescence measurements on the CdSe/DPA mixtures confirmed that the DPA singlet lifetime is unaffected by the presence of the NCs (FIG. 19). In accordance with an exemplary embodiment, this system still has room for further efficiency gains by modifying the NC size or geometry, ligand structure, and emitter molecule.

To explain the enhanced upconversion, in accordance with an exemplary embodiment, one hypothesis is that the anthracene-COOH ligands form an energy cascade outlined in Strategy B in FIG. 1. Given the CdSe bandgap of 18870 $cm^{-1}$ (or 2.34 eV), as estimated from the PL peak, the triplet energy of 9-ACA (14760 $cm^{-1}$ or 1.83 eV) and the triplet energy of DPA (14290 $cm^{-1}$ or 1.77 eV), there is a downhill path for the energy from the CdSe to the 9-ACA to the DPA. To confirm that the anthracene ligands act as intermediate energy acceptors, the PL lifetimes of CdSe NCs with and without the 9-ACA ligand were measured. The results (FIG. 19) show that this ligand generates substantial quenching of the NC photoluminescence on timescales >10 ns. The observed shortening of the CdSe lifetime, combined with the large enhancement in upconversion efficiency, prove that Strategy B is an effective strategy to enhance energy transfer from the semiconductor NC to the emitter triplet state.

Finally, the reason why the emissive singlet states of RUB and DPA are not quenched by the NC sensitizers was considered. The Förster radii for RUB→PbSe and DPA→CdSe energy transfer lie in the 5-6 nm range (supplementary online text). If the RUB singlet state is excited while in close proximity to the NC, we would expect substantial fluorescence quenching. But given a diffusion coefficient of $10^{-5}$ $cm^2/s$ and a triplet lifetime of 80 μs, the RUB can diffuse more than 100 nm after its triplet state is populated by the PbSe exciton. The long triplet lifetime allows it to escape the critical Förster radius around the PbSe NC. Similar considerations apply to the CdSe/DPA system. The weak nonradiative quenching of the emitters means that there is no fundamental limit on the ability of the emitter molecules to emit upconverted photons, although radiative transport of these photons through an absorbing sample may prove to be a challenge.

In accordance with an exemplary embodiment, the results of this disclosure show that the use of inorganic NC sensitizers can be a viable strategy for extending upconversion into the NIR spectral region. In accordance with an exemplary embodiment, the ability of the PbSe/RUB system to upconvert 980 nm light to 550 nm opens up the possibility of using upconversion to enhance the efficiency of currently used photovoltaic materials like CdTe. The CdSe/DPA system demonstrates that using conjugated organic ligands, rather than the standard alkyl ligands, can lead to an energy cascade process that enhances the overall efficiency by up to three orders of magnitude. Extending this strategy to the PbSe/RUB system provides a clear path for making hybrid organic-inorganic nanomaterials that can upconvert infrared photons with high efficiency.

1. Sample Preparation and Characterization
A) Materials

Chemical reagents were purchased from Aldrich Chemical Co, Strem, TCI America, or Alfa Aesar and were used as received. Dry and degassed acetone and toluene were obtained from JC Meyer's solvent purification system. 9,10-diphenylanthracene (DPA), 2-anthracenecarboxylic acid (2-ACA), 1-anthracenecarboxylic acid (1-ACA), and 9-anthracenecarboxylic acid (9-ACA) were obtained from TCI AMERICA, rubrene (RUB) was obtained from Acros Organics, and 9-anthracenepropionic acid (100 mg) was obtained from Molecular Probes. All molecules were used as received.

B) Instrumentation

Absorption spectra were recorded on a Jasco-V670 UV-Vis absorption spectrophotometer. Ensemble fluorescence spectra were recorded on a HORIBA FluoroMax-3 fluorometer. Upconversion fluorescence spectra were recorded on an Ocean Optics Inc. JAZ spectrometer. Fluorescence signals for the power-dependence and quantum yield measurements were acquired using a Hamamatsu H5783 photomultiplier tube equipped with interference and edge filters to isolate the RUB and DPA emission wavelengths. Lasers used: 532 nm light was obtained from a Coherent Sapphire diode laser, with an output power of 10 mW. 800 nm laser light was obtained from a Kapteyn-Murnane Labs Ti:Sapphire laser pumped by a Spectra Physics Millenia laser. The laser was operated in cw mode. 980 nm laser light was obtained from a Amonics ALS-980-MM-1-SA fiber-coupled diode laser. Laser powers were measured using an Ophir Vega power meter with 3 A and PD300 low power detector heads.

Transmission electron microscopy was performed on a Tecnai12 TEM. NMR spectra were recorded on a Varian Inova-400 MHz NMR spectrometer at room temperature. The $^1H$ Chemical shifts (δ) are reported in parts per million with residual solvent ($CHCl_3$) peak as an internal standard.

C) Nanoparticle Synthesis
C.1) Synthesis of CdSe Nanocrystals

CdSe nanocrystals (NCs) were synthesized and purified by the procedure published by Carbone et al. Trioctylphosphine oxide (TOPO) (3.0 g), octadecylphosphonic acid (ODPA) (0.280 g) and CdO (0.060 g) were mixed in a 25 mL three neck flask, heated to approximately (ca.) 150° C. and exposed to vacuum for 1 hour. Then, under Ar (g), the solution was heated to above 300° C. to dissolve the CdO until it formed a clear light yellow solution. At this point, 1.5 g of trioctylphosphine (TOP) was injected and the temperature was allowed to recover to the value required for the injection of the Se:TOP solution (0.058 g Se+0.360 g TOP) to create a NC with a specific diameter. For example, for the synthesis of 3.28 nm diameter CdSe, the injection temperature was 375° C. Immediately after injection, the reaction flask was cooled down quickly with compressed air. After the synthesis, as-prepared CdSe NCs were transferred to the glove box and cleaned with methanol and toluene at least three times. The final pellet was dissolved in toluene and stored inside a nitrogen glove box for future use. The NC concentration and diameter was determined by measuring the absorbance at the first exciton absorption maxima and calculated according to Yu et al. The quantum yield of the 3.28 nm diameter particles is 0.12 with Rhodamine 6G (R6G) as the standard.

C.2) Synthesis of PbS Nanocrystals (36)

PbO (0.45 g), oleic acid (OA, 10 mL), and 1-octadecene (ODE, 10 mL) were mixed in a 50 ml three-neck flask and heated to 110° C. under vacuum for an hour. Pb oleate is formed, indicated by the discoloration of the reaction to a clear light yellow solution. Then, the reaction flask was backfilled with Ar (g), and heated to 150° C. At 150° C., the selenide precursor, containing 0.21 mL of bis(trimethylsilyl)selenide in 10 mL of anhydrous ODE, was injected, and the temperature dropped to about 130° C. The reaction flask was allowed to cool down to 100° C. for 3 min by turning off the heater. Then the reaction flask was kept at 100° C. for 5 min. The PbSe NCs were transferred to a glovebox and washed 3 times by adding 1:1 hexanes/ethanol mixture; followed by centrifuging at 7000 rpm for 5 min. The supernatant was discarded. The final pellet was dissolved in hexane and stored in the dark inside the glovebox for future use. The PbS NC size (3.1 nm diameter) was determined by measuring the energy of the first exciton peak. The concentration of the PbS NCs was determined from the absorption at 400 nm.

C.3) Synthesis of PbSe Nanocrystals

The same general method in Section (C.2) above was used, with the only difference being the sulfur precursor used was 0.21 ml bis(trimethylsilyl)selenide instead of 0.21 ml bis(trimethylsilyl)sulfide. The size and concentration of PbSe nanocrystals were determined by measuring the energy of the first exciton peak and the absorption at 400 nm respectively.

2. Upconversion Characterization

A) CdSe+9-anthracene carboxylic acid (9ACA)+DPA

A.1) Effect of Concentration of 9-ACA Using Ligand Exchange 0.797 ml of 3.28 nm diameter CdSe NCs in toluene (with a concentration of $2.51*10^{-5}$M) and different amounts of 9-ACA in a mixture of acetonitrile:toluene=3:11 (v/v) solution were mixed and stirred for 1.5 hours. An equal volume of acetone was added. The resulting solution was centrifuged at 7830 rpm for 10 min. The resulting pellet was redispersed in 0.98 ml toluene, followed by adding 20 µL of a 0.05M DPA dissolved in toluene solution. The entire procedure was performed in a nitrogen glovebox. Note that the solubility of 9-ACA reaches a limit of 0.0216M in 3:11 (v/v) acetonitrile:toluene. Upconversion samples were prepared in a $N_2$ glovebox with air-free cuvettes sealed with parafilm.

Figure 10:
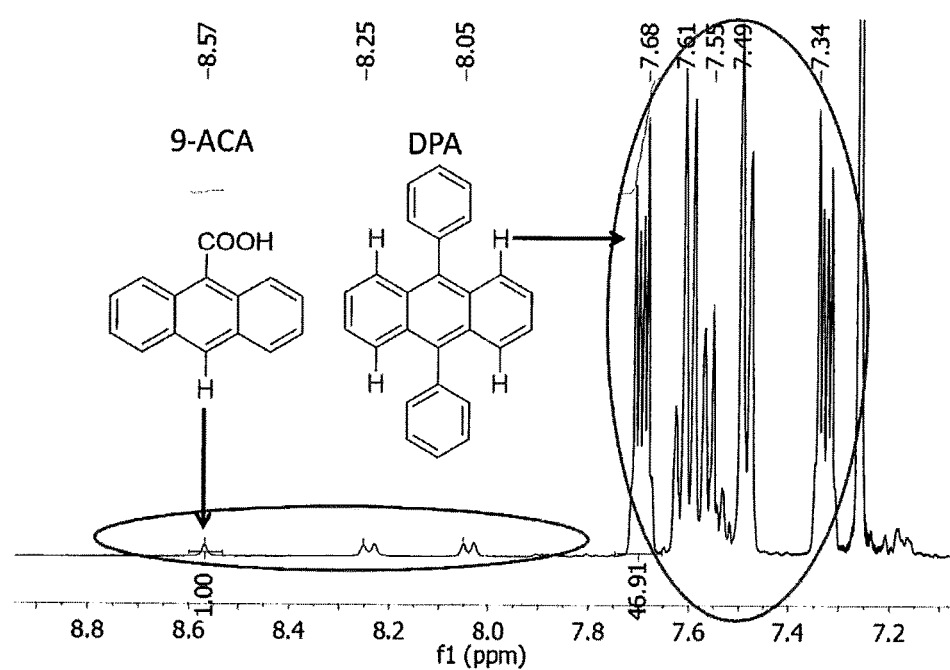
FIG. 10 shows the NMR spectrum of the aromatic region of the sample with 0.015M of 9-ACA in the ligand exchange solution that had the highest upconversion signal from DPA in FIG. 9, and where Approximately 13 transmitter 9-ACA ligands are bound per CdSe NC.

As shown in FIG. 10, the upconversion signal increases with increasing 9-ACA in the ligand exchange solution, implying that the more 9-ACA bound to the CdSe NCs, the more efficient the energy transfer.

A.2) Estimation of Surface Coverage of CdSe by 9-ACA by NMR

Figure 9:
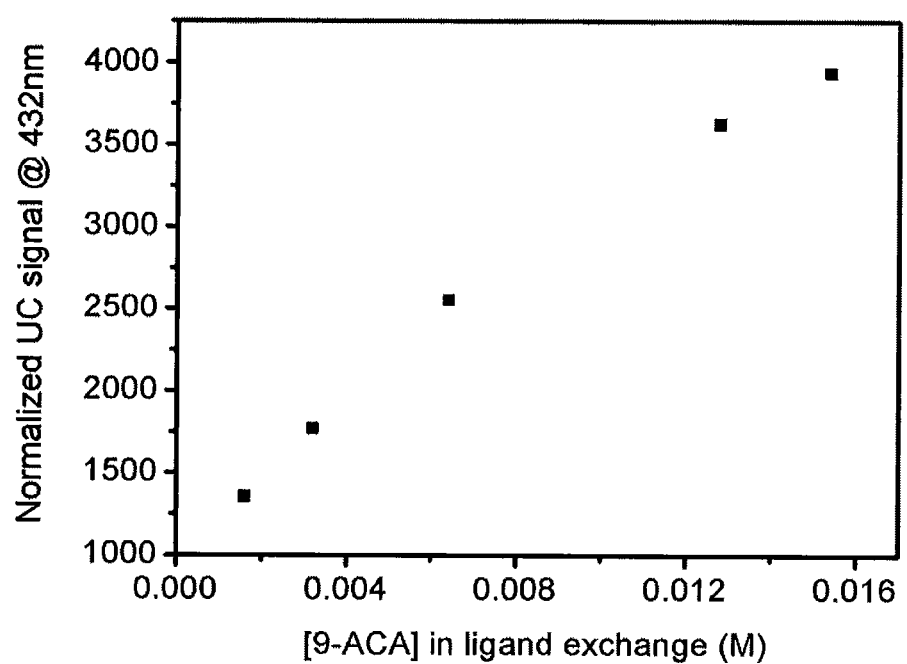
FIG. 9 shows the emission from DPA, as given by the intensity of its emission maximum (432 nm) when sensitized by CdSe, plotted against the concentration of the transmitter 9-ACA in the ligand exchange solution, where the upconversion signal is normalized by dividing the peak maxima by [CdSe] (in µM), the measurement was conducted at room temperature, with the functionalized CdSe NCs in toluene with 1 mM DPA, excited by a 532 nm cw Coherent Sapphire laser, and the laser power was 9.2 mW, measured after being focused with a 500 mm focal length lens.
Figure 11:
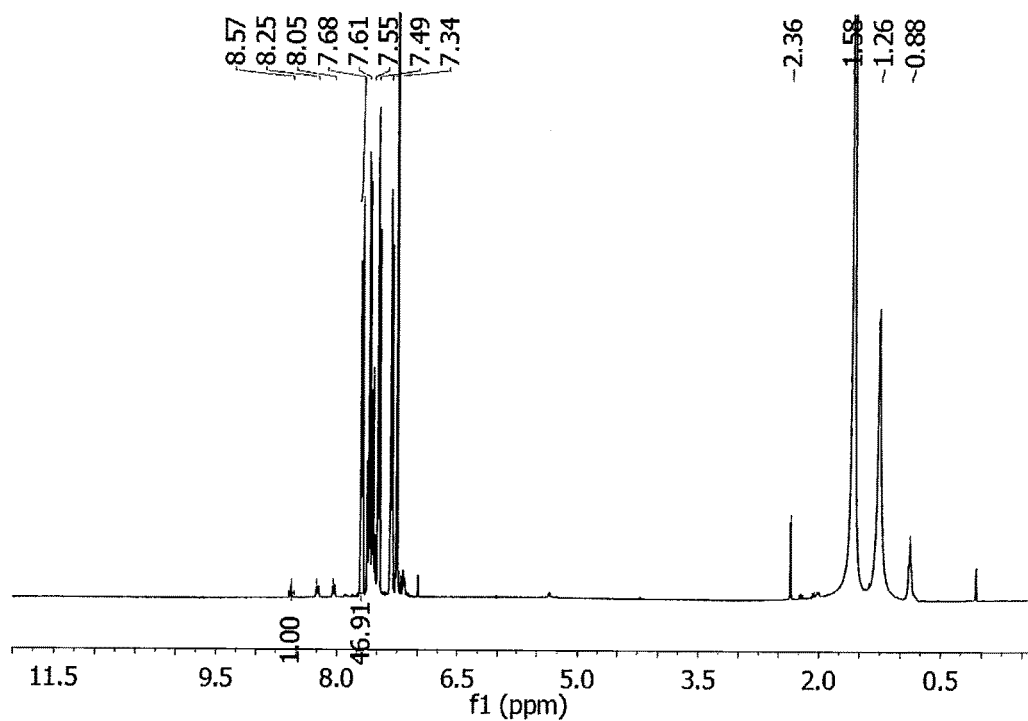
FIG. 11 shows the full NMR spectrum of the sample in FIG. 10.

NMR was performed on the sample with the highest concentration of 9-ACA (0.015M) in FIG. 9. The toluene was evaporated and the entire sample dissolved in CDCl$_3$. Comparing the area under the peak in the $^1$H NMR spectrum (FIG. 11) with the known DPA concentration of 1.0 mM, the molar ratio of 9-ACA and DPA is 1:47.49/4=1:11.87. For 9-ACA, the singlet at 7.53 ppm corresponds to the proton at the 10 position in 9-ACA, while for DPA, the multiplet at 7.35 ppm corresponds to the 4 protons at the 1, 4, 5 and 8 positions on the conjugated core. From this, the concentration of 9-ACA is 84.2 µM in the solution used for upconversion. The concentration of the 3.28 nm diameter CdSe is 6.43 µM. This gives a surface coverage is 13 9-ACA molecules per particle, indicating full ligand exchange has not occurred.

A.3) Effect of Concentration of CdSe

The upconversion signal was found to increase linearly with CdSe concentration over the range (0.4-6 µM), as did the absorption by the CdSe. This result suggested that the upconversion yield is independent of the CdSe concentration over this range.

A.4) Effect of Different Anthracene Ligand

Figure 12:
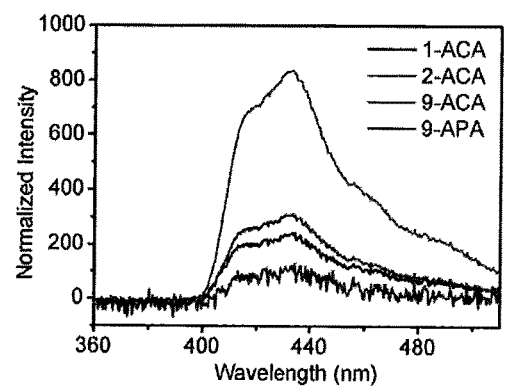
FIG. 12 shows upconversion photoluminescence spectra of different anthracene ligands. Samples are prepared with 1.62 mM anthracene ligands in the ligand exchange solutions. [DPA]=1 mM, and where the upconversion signal is scaled by dividing the spectra by [CdSe] (in µM).

FIG. 12 shows the upconversion spectra taken for CdSe/DPA with the four different anthracene carboxylic acid ligands. The samples were prepared under the same conditions as described Section 2, part A.1. Because the CdSe concentration varied slightly between samples, the spectra were scaled by the different CdSe concentrations. In FIG. 13, the optimized CdSe/9-ACA/DPA upconversion sample was compared to that of CdSe/ODPA/DPA. The DPA fluorescence is undetectable in the ODPA sample, and the logarithmic plot shows that the 9-ACA ligand leads to a factor of $10^3$ increase in this signal above the noise.

B) PbSe+Rubrene

B.1) Effect of PbSe NC Concentration

A 1.5 ml solution of 2.1 nm diameter PbSe NCs in hexanes with a concentration of $1.33*10^{-3}$M was spun down by adding 3 ml acetone and centrifuged at 7830 rpm for 20 min, and then redispersed in 1.2 ml toluene. This solution was diluted with toluene to obtain PbSe with different concentrations. 0.5 mL of the diluted PbSe solution and 0.5 ml of 2.0 mM rubrene in toluene was mixed.

Figure 14:
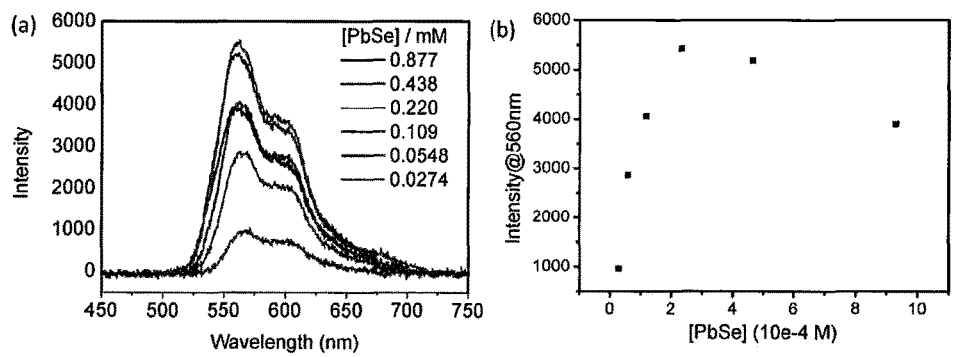
FIG. 14 shows (a) the emission from 1.0 mM of RUB in toluene, when sensitized by PbSe is plotted for different concentrations of PbSe, (b) The peak maxima from (a) at 560 nm is plotted against increasing concentrations of PbSe NCs. Measurements were conducted using a 1 cm cuvette with an 800 nm continuous wave (cw) laser with front-face detection and the laser power was 166 mW.

The data in FIG. 14 show an increase in the upconversion signal with PbSe NC concentration, followed by a decrease after $2*10^{-4}$ M. Since the entire 800 nm beam is absorbed in the 1 cm cuvette, absorption of the upconverted light by the PbSe may affect the signal at higher concentrations, or it could indicate self-quenching by the PbSe NCs. To be safe, the quantum yield and power dependent measurements were done using a NC concentration of $5*10^{-5}$ M in order to avoid the nonlinear region of the curve in FIG. 14$b$.

B.2) Characterization of Rubrene Concentration 0.5 ml of 2.11 nm diameter PbSe in toluene solution with concentration of $7.61*10^{-5}$M was mixed with 0.5 mL of 4.0, 2.0, 1.0, 0.50 and 0.25 mM rubrene in toluene solution respectively.

Figure 15:
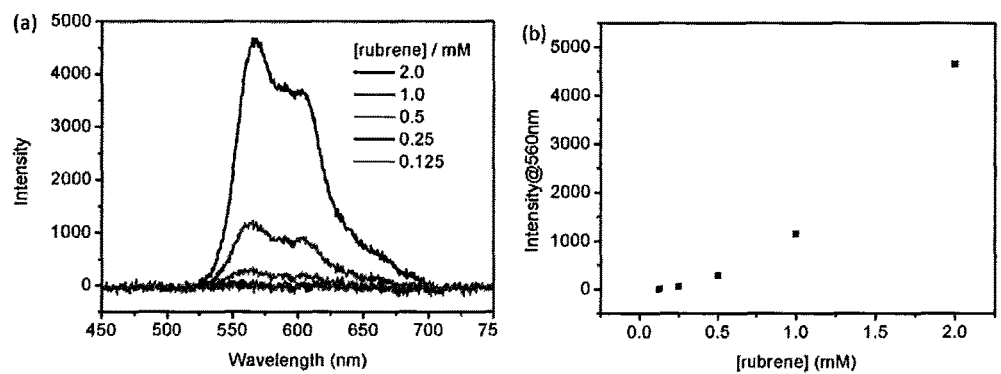
FIG. 15 shows (a) the emission from RUB at different molarities in toluene sensitized by PbSe (0.764 mM), normalization is done by dividing the spectra by [PbSe] (in mM); and (b) the peak maxima from (a) at 560 nm are plotted against RUB concentration. Measurements were conducted at room temperature with an 800 nm cw laser with front-face detection and the laser power was 166 mW.

The upconversion efficiency increased with increasing RUB concentration up to the solubility limit of RUB in toluene, as shown in FIG. 15. Quantum yield and power dependent measurements were performed with 4 mM of RUB, the maximum concentration that could be achieved in toluene.

3. Quantum Yield Measurements

A) Sample Preparation

CdSe+9-anthracene carboxylic acid+DPA

Ligand exchange was conducted according to the general method in Section 2 part A with 54.4 ul of 2.7 nm diameter CdSe toluene solution with concentration of $8.05*10^{-5}$M, 1.96 ml of 9-anthracenecarboxylic acid solution (0.0216M) in acetonitrile:toluene, 3:11 (v/v), and 12 h ligand exchange time. For the quantum yield standard, Rhodamine 6G in ethanol was used (quantum yield=0.95).

PbSe+Rubrene 41.2 µL of 2.1 nm diameter PbSe in hexane solution with concentration of $1.33*10^{-3}$ M, and 958.8 uL rubrene in toluene solution (4.0M) was mixed.

B) Absolute Quantum Yield Calculation for CdSe

The upconversion quantum yield ($\Phi_{NC}$) is calculated by equation S1

$$\Phi_{uc} = 2 \times \Phi_{R6G} \times \frac{n_{DPA}^2}{n_{R6G}^2} \times \frac{[Area]_{DPA}}{[Area]_{R6G}} \times \frac{1-10^{-A_{R6G}}}{1-10^{-A_{CdSe}}} \quad (S1)$$

where $\Phi_{R6G}$ is the quantum yield of R6G, $n_{DPA}$ and $n_{R6G}$ represent the refractive index of the solvents for the DPA upconversion system and R6G, which are hexane and ethanol, respectively. $[Area]_{DPA}$ and $[Area]_{R6G}$ are the integrated areas of the fluorescence peaks of DPA and R6G. $A_{CdSe}$ and $A_{R6G}$ stand for the absorbance of CdSe NCs and R6G at 532 nm.

Figure 16:
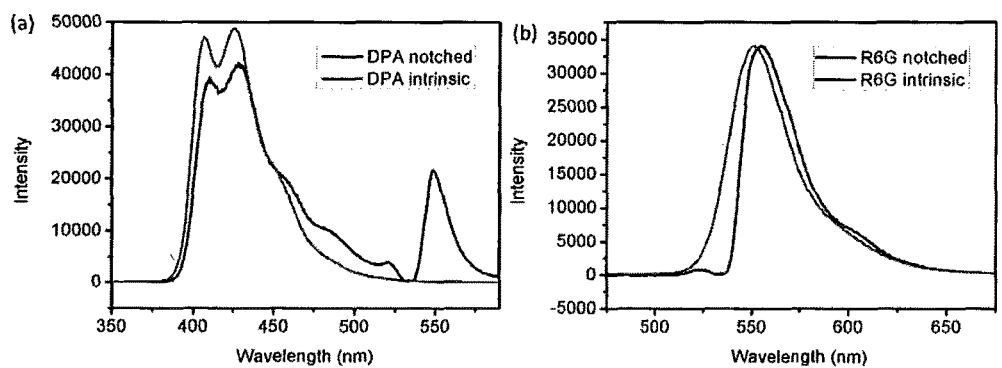
FIG. 16 shows (a) Intrinsic (red) and detected (black) upconversion fluorescence spectra of DPA, where the intrinsic fluorescence spectrum is scaled to match the upconversion spectrum at 450 nm, and (b) Intrinsic (red) and detected (black) fluorescence spectra of the quantum yield standard Rhodamine 6G (R6G), where the intrinsic spectrum is scaled to match the experimental spectrum at 550 nm.
Figure 17:
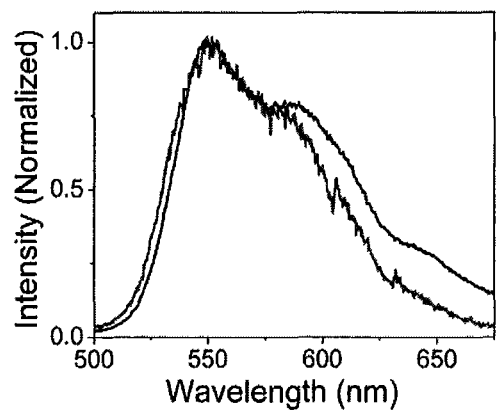
FIG. 17 shows a comparison of early time (0-100 ns, black) and late time (0.6-390 microseconds, red) fluorescence from the PbSe/RUB sample after excitation with 800 nm laser pulse. The early spectrum reflects prompt fluorescence due to nonresonant two-photon excitation of the RUB, while the delayed fluorescence is due to upconverted signal after TTA by RUB molecules sensitized by PbSe NC's. The slightly different spectral shapes reflect additional self-absorption of the prompt (two-photon) fluorescence due to the deeper penetration of the two-photon excitation mode into the sample cuvette.

The detected upconversion fluorescence spectrum of DPA and the fluorescence spectrum of the R6G standard are distorted by the presence of the 532 notch filter that is necessary to block scattered 532 nm laser light. To correct for these distortions, the intrinsic fluorescence spectra was scaled so they match the detected spectra at specific wavelengths as shown in FIG. 16. Values $\Phi_{R6G}=0.95$, $n_{DPA}=1.375$ and $n_{R6G}=1.360$, $[Area]_{DPA}=51896$ (after dividing by 50 to account for integration time), $[Area]_{R6G}=1555077$, $A_{CdSe}=0.192$ and $A_{R6G}=0.312$ were then used. Plugging these values into Equation S1 leads to a value of 0.093 for the upconversion quantum yield $\Phi_{uc}$. Different spectral scaling methods could change this value slightly, leading to an error range of ±2%

C) Quantum Yield Calculation for PbSe (800 nm)

These measurements were done on samples with a PbSe nanoparticle concentration of $5.5*10^{-5}$ and $[RUB]=4*10^{-3}$ M. A demountable cell (Pike Technologies 162-1100) with a pathlength of 100 mm was used in order to make the sample optically thin and ensure a uniform beam intensity. The 800 nm beam was reflected off a dichroic mirror and focused to spot size of approximately 150 µm diameter. The 800 nm power was adjusted to put the upconverted fluorescence signal well into the linear regime with an intensity of 1000 W/cm². For the reference sample (RUB in toluene), the sample was excited at 400 nm using the frequency doubled output of a Ti:Sapphire laser. The laser beams were chopped and the output of the photomultiplier tube was detected on a lockin amplifier (SRS 810). Both the RUB and PbSe/RUB fluorescence signals were checked for linearity.

$$\Phi_{UC} = 2\Phi_{ref} \times \frac{(\text{photons absorbed by reference})}{(\text{photons absorbed by } UC \text{ sample})} \times \frac{\text{signal}(UC \text{ sample})}{\text{signal(reference)}} \quad (S2)$$

$\Phi_{ref}$ is the quantum yield of RUB and is 0.98. The detected signals were 6.00 mV for a 18 µW of 400 nm laser power, and 2.46 mV for 192.2 mW of 800 nm laser power. Note that we use 1000× more 800 nm laser power. The absorbance of the RUB sample at 400 nm was measured to be 0.0295 using a process of serial dilution. The absorbance of the PbSe sample at 800 nm was measured to be 0.0116. The number of photons absorbed is calculated using the relation $$\text{photons absorbed/s} = \frac{\text{Laser Power}}{hc/\lambda}(1-10^{-Abs}) \quad (S3)$$

h is Planck's constant, c is the speed of light, and Abs is the sample absorption at 400 nm. Using Equation S3 for $\lambda=400$ nm and $\lambda=800$ nm with the given powers and absorbances, these values were substituted into Equation S2 to obtain $\Phi_{UC}=9.3*10^{-5}$. By taking possible errors in laser power, detection, and background into account, we can find a variation of roughly $0.5*10^{-5}$, leading to our reported value $\Phi_{UC}=1.0 (\pm 0.5)*10^{-4}$.

D) Quantum Yield Estimation for PbSe (980 nm)

The 980 nm output from the fiber laser could not be focused tightly at the same location as the 800 nm beam, so the 800 nm laser was attenuated in order to put both upconversion efficiencies into the quadratic regime. A 1 cm cuvette was used to help ensure that 100% of both beams was absorbed in the sample and detected the fluorescence from the front face using a photomultiplier tube. In this regime, the upconverted signal is proportional to the intensity squared multiplied by the laser spot size.

$$\frac{\Phi_{980}}{\Phi_{800}} = \frac{((800 \text{ nm power})/A_{800})^2}{((980 \text{ nm power})/A_{980})^2} \times \frac{A_{800}}{A_{980}} \times \frac{\text{signal}(980 \text{ nm})}{\text{signal}(800 \text{ nm})} \quad (S4)$$

$A_{800}$ is the area of the 800 nm beam, and $A_{980}$ is the area of the 980 nm beam. The 800 nm power was measured to be 7.19 mW, the 980 nm power to be 79.1 mW, the signal from the 980 nm was 25.4 mV, the signal from the 800 nm was 17.0 mV, the 800 nm beam radius was 0.074 mm, and the 980 nm beam radius was 0.54 mm. The area is proportional to the spot radius squared. Plugging all these values into Equation S4 yielded a quantum yield ratio $$\frac{\Phi_{980}}{\Phi_{800}} = 0.64,$$

but we emphasize that there is quite a bit of uncertainty in this ratio due to the nonuniform excitation intensity as the beams are absorbed in the 1 cm cuvette, and it could be a factor of 2 higher or lower. A factor of 2 lower leads to $$\frac{\Phi_{980}}{\Phi_{800}} = 0.32,$$

and so we conservatively estimate that $\Phi_{980}$ is within a factor of 3 of $\Phi_{800}$.

4. Intensity Dependence

A) Sample Preparation

PbSe+Rubrene

See Section 3 part A. $[PbSe]=5.48*10^{-5}$, and $[RUB]=3.84$ mM.

CdSe+9-ACA+DPA

The sample was prepared with the similar method in Section 2, part A, with 1.96 ml 9-ACA acetonitrile/toluene 3:11 (v/v) solution. $[CdSe]=6.05*10^{-7}$ M and $[DPA]=1.00$ mM.

B) Intensity Dependent Measurements

The low concentration of CdSe used in these measurements allowed the use of a 1 cm pathlength cuvette, since these samples were still optically thin at the 532 nm excitation wavelength. The CdSe/DPA mixture was placed in a 1 cm cuvette and the 532 nm light was focused using a 50 cm focal length lens. The depth of focus exceeded the detection volume. The fluorescence was detected at a right angle to the excitation with a photomultiplier tube with filters to remove the 532 nm laser scatter and isolate the 450 nm DPA emission. The output of the photomultiplier tube was directed into a lockin amplifier, which was synchronized to the frequency of laser modulation (200 Hz) by a mechanical chopper. This detection system was measured to have a linear response over 3 orders of magnitude. The laser intensity was varied by using different value neutral density filters, and the power was measured at every setting.

For the PbSe/RUB mixtures, the samples had a PbSe nanoparticle concentration of $5.5*10^{-5}$ and $[RUB]=4*10^{-3}$ M. These samples were highly absorbing, so a demountable cell with a pathlength of 100 mm was used in order to make the sample optically thin and ensure a uniform beam intensity. The 800 nm beam was reflected off a dichroic mirror and focused to spot size of approximately 150 micron diameter. The laser intensity was varied by using different value neutral density filters, and the power was measured at every setting. The fluorescence was collected using a 4 cm focal length lens on the other side of the dichroic and focused into a photomultiplier tube. The output of the photomultiplier tube was directed into a lockin amplifier, which was synchronized to the frequency of laser modulation (200 Hz) by a mechanical chopper. This detection system was measured to have a linear response over 3 orders of magnitude.

5. Time-resolved Photoluminescence

A) Sample Preparation

PbSe+Rubrene

The sample was prepared as described in Section 3 part A. $[PbSe]=5.9*10^{-5}$ M, and $[RUB]=2.00$ mM.

CdSe+9-ACA+DPA

The sample was prepared as described in Section 2, part A. $[CdSe]=3.5*10^{-6}$ M, and $[DPA]=1.00$ mM.

B) Time-resolved Measurements

A diode-pumped (Verdi, Coherent) Ti:Sapphire oscillator (Vitesse, Coherent) and Nd:YLF pumped (Evolution, Coherent) regenerative amplifier (Libra) yields 800 nm 100 fs pulses at 1 kHz (3.8 W). PbSe/RUB and RUB-only samples were excited with the 800 nm fundamental. CdSe/ODPA, CdSe/9ACA/DPA and DPA-only samples were excited at 400 nm with frequency doubled 800 nm (BBO). The sample (1 cm capped quartz cuvette) was placed such that the incident excitation beam (0.1 microwatt) was focused (focal length=20 cm) on the sample. The fluorescence was collected using front-face detection at an angle of approximately 10 degrees with respect to the excitation beam. The emission was collected with a lens (focal length=20 cm) and then imaged (focal length=5 cm) into a Hamammatsu C4334 streak camera detector. Residual 800 nm and 400 nm were removed with a hot-mirror and a long-wave pass 420 nm filter before the detector, respectively. Time-resolved data for the CdSe/ODPA, CdSe/9ACA/DPA and DPA-only samples were collected using 1 ns and 100 ns sweep windows with a center collection wavelength of 570 nm. PbSe/RUB and RUB-only time-resolved data were collected at 100 ns and 500 μs sweep windows with a center collection wavelength of 600 nm.

B.1) Characterization of Delayed Fluorescence from PbSe/RUB.

When 800 nm femtosecond pulses excite the PbSe/RUB sample, there are both prompt (nanosecond) and delayed (microsecond) fluorescence components. The spectra of both components are almost identical, as shown in FIG. 18, and correspond to the RUB singlet emission.

Figure 18:
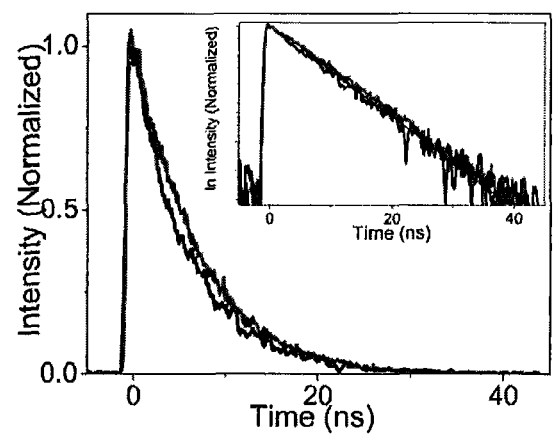
FIG. 18 shows a comparison of the fluorescence decays of DPA by itself (black) and the CdSe/9-ACA/DPA sample (red). Inset: Logarithmic comparison of the decay. Both are single exponential with a lifetime of 6.5+/−0.1 ns for the CdSe/9-ACA/DPA sample and 6.3+/−0.1 ns for the DPA sample.

FIG. 18 shows a comparison of early time (0-100 ns, black) and late time (0.6-390 μs, red) fluorescence from PbSe/RUB sample after excitation with 800 nm laser pulse. The early spectrum reflects prompt fluorescence due to nonresonant two-photon excitation of the RUB, while the delayed fluorescence is due to upconverted signal after TTA by RUB molecules sensitized by PbSe NC's. The slightly different spectral shapes reflect additional self-absorption of the prompt (two-photon) fluorescence due to the deeper penetration of the two-photon excitation mode into the sample cuvette.

B.2) Characterization of Fluorescence from CdSe/9ACA/DPA.

When the CdSe/9ACA/DPA sample is excited with 400 nm, the fluorescence is dominated by the DPA emission. The fluorescence decays for the CdSe/9ACA/DPA sample and DPA in dilute toluene solution are identical to within the experimental error, as shown in FIG. 19.

B.3) Characterization of Quenching of CdSe Photoluminescence by 9-ACA ligand.

Figure 20:
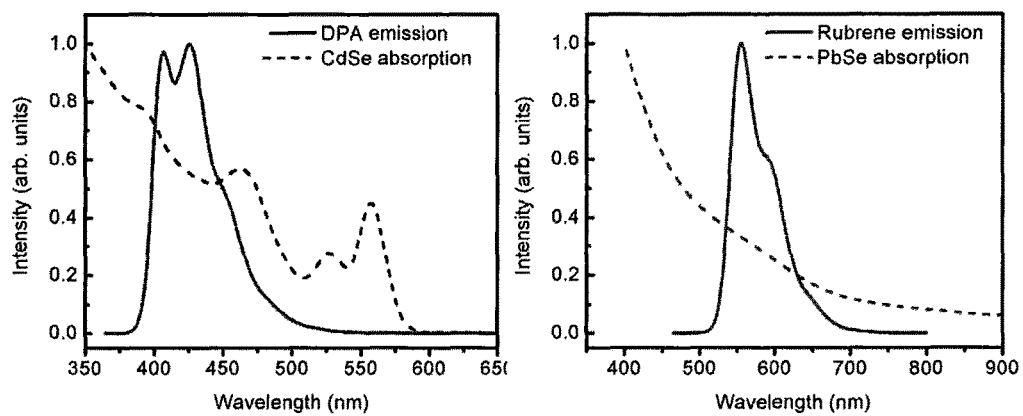
FIG. 20 shows normalized absorption and emission for donor and acceptor pair of DPA & CdSe (left) and RUB & PbSe (right).
Figure 21:
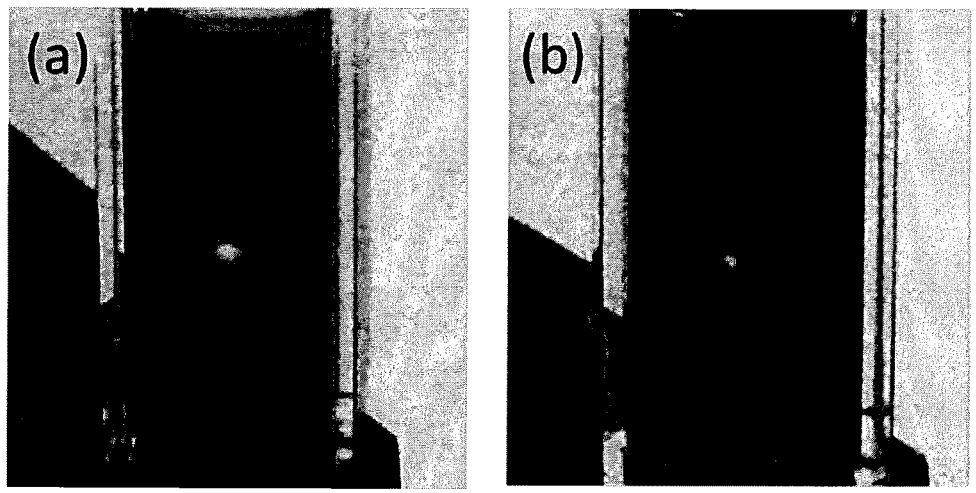
FIG. 21 shows photographs of upconversion in a cuvette containing PbSe/RUB mixture, where the yellow spot is emission from the RUB originating from (a) an unfocused cw 800 nm laser with an intensity of 300 W/cm$^2$, and (b) a focused cw 800 nm laser with an intensity of 2000 W/cm$^2$. The photographs were taken with an iphone 5 and were not modified in any way.
Figure 22:
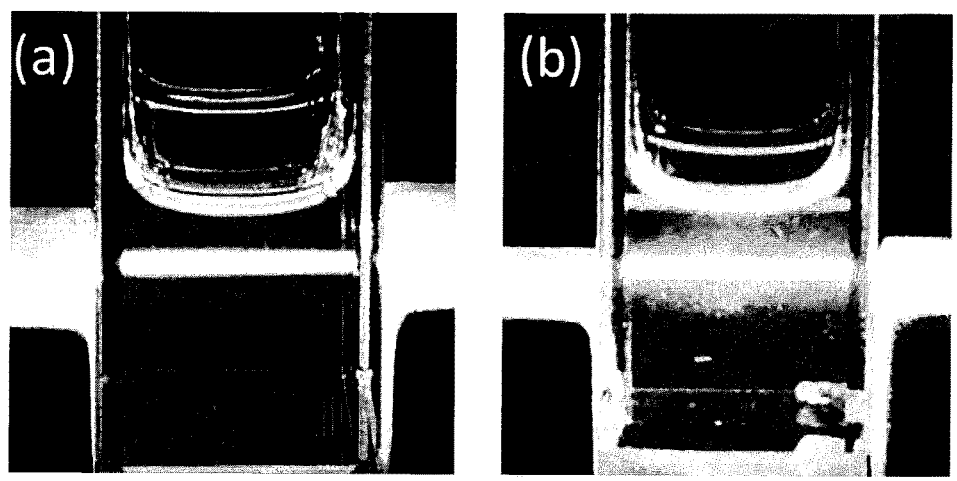
FIG. 22 shows photographs of upconversion in a cuvette containing (a) an optimized CdSe/9-ACA/DPA and (b) a CdSe/ODPA/DPA mixture (the spectra of these samples are shown in FIG. 15b), wherein they were excited with a focused cw 532 nm laser, the violet DPA output in (a) swamps the green beam that is clearly seen in (b), where no upconversion takes place, which indicates the enhancement of the upconverted fluorescence by the 9-ACA ligand. The photographs were taken with an iphone 5 and were not modified in any way.

Lastly, the photoluminescence decay of a CdSe/9-ACA sample was compared to that of a CdSe/ODPA sample (no DPA acceptor in either sample). For the CdSe/9-ACA sample, the 400 nm beam excited a significant amount of free 9-ACA ligands in solution, and the narrow CdSe peak at 570 nm had to be isolated from the 9-ACA emission that stretches from 450 to 550 nm. An example of the spectral data, along with its decomposition into 9-ACA and CdSe components, is shown in FIG. 20a. The acceleration of the CdSe component is shown in FIG. 20b in the 100 ns window.

6. Förster Radius Calculation

The Förster radius for energy transfer from the singlet emitter to the NC sensitizer is calculated using the standard equation below. Note that in this case, the DPA and RUB act as energy donors, while the CdSe and PbSe NCs act as energy acceptors.

$$R_0^6 = \frac{9000 Q_D (\ln 10) \kappa^2 J}{128 \pi^5 n^4 N_A}, \quad J = \int_0^\infty F_D(\lambda) \varepsilon_A(\lambda) \lambda^4 d\lambda$$

$R_0$: Förster distance $Q_D$: quantum yield of donor.

$\kappa$: orientation factor, 0.667 (isotropic)

$J$: overlap integral.

$F_D$: Normalized donor emission spectrum.

$\varepsilon_A(\lambda)$: extinction coefficient of the acceptor at $\lambda$.

$n$: refractive index of toluene.

$N_A$: Avogadro constant, $6.02*10^{23}$.

|  | CdSe(3.2 nm) & DPA | PbSe (2.1 nm) & rubrene |
|---|---|---|
| $Q_D$ of donor(19) | 0.97 | 0.98 |
| $\varepsilon_A$ of acceptor | $1.17*10^5$ (@557 nm) | $2.59*10^5$ (@400 nm) |
| J (cm$^6$ · mol$^{-1}$) | $4.98*10^{-13}$ | $9.29*10^{-13}$ |
| n | 1.496 | 1.496 |
| $R_0$(Å) | 57.9 | 64.3 |

The detailed description above describes to a hybrid molecule-nanocrystal photon upconversion across the visible and near-infrared spectral region. The invention is not limited, however, to the precise embodiments and variations described. Various changes, modifications and equivalents can effected by one skilled in the art without departing from the spirit and scope of the invention as defined in the accompanying claims. It is expressly intended that all such changes, modifications and equivalents which fall within the scope of the claims are embraced by the claims.

What is claimed is:

1. A method of upconverting two low energy photons into one high energy photon, the method comprising:
    synthesizing semiconductor nanocrystals; and
    combining the as-synthesized semiconductor nanocrystals with molecular emitters to upconvert photons in both visible and infrared spectral regions by combining cadmium selenide (CdSe) with diphenylanthracene (DPA) to upconvert visible light to blue or ultraviolet light.

2. The method of claim 1, comprising:
    surrounding the as-synthesized semiconductor nanocrystals with a native alkyl-terminated carboxylic acid or phosphonic acid ligands.

3. The method of claim 1, comprising:
    replacing ODPA ligands with anthracene derivatives functionalized with carboxylic acid groups to facilitate energy transfer.

4. The method of claim 3, wherein the carboxylic acid is 9-anthracene carboxylic acid (9-ACA).

5. The method of claim 1, comprising:
    using the upconverted photons in multiphoton imaging.

6. The method of claim 1, comprising:
    using the upconverted photons in an optical display.

7. The method of claim 1, comprising:
    using the upconverted photons in a lighting and solar energy conversion scheme, photovoltaics, and/or solar fuel production.

8. A method of upconverting two low energy photons into one high energy photon, the method comprising:
    synthesizing semiconductor nanocrystals; and
    combining the as-synthesized semiconductor nanocrystals with molecular emitters to upconvert photons in both visible and infrared spectral regions by combining lead selenide (PbSe) with rubrene (RUB).

9. The method of claim 8, comprising:
    capping the PbSe semiconductor nanocrystals with oleic acid ligands.

10. The method of claim 8, comprising:
    using the upconverted photons in multiphoton imaging.

11. The method of claim 8, comprising:
    using the upconverted photons in an optical display.

12. The method of claim 8, comprising:
    using the upconverted photons in a lighting and solar energy conversion scheme, photovoltaics and/or solar fuel production.

13. The method of claim 8, comprising:
    upconverting infrared light to a visible light.

14. An upconversion system, the upconversion system comprising:
    synthesized semiconductor nanocrystals; and
    molecular emitters combined with the synthesized semiconductor nanocrystals, wherein the synthesized semiconductor nanocrystals combined with the molecular emitters are cadmium selenide (CdSe) with diphenylanthracene (DPA) to upconvert visible light to blue or ultraviolet light or lead selenide (PbSe) with rubrene (RUB).

15. The upconversion system of claim 14, wherein the cadmium selenide (CdSe) with diphenylanthracene (DPA) upconversion system is surrounded with a native alkyl-terminated carboxylic acid or phosphonic acid ligands.

16. The upconversion system of claim 15, wherein ODPA ligands are replaced with anthracene derivatives functionalized with carboxylic acid groups to facilitate energy transfer.

17. The upconversion system of claim 16, wherein the carboxylic acid is 9-anthracene carboxylic acid (9-ACA).

18. The upconversion system of claim 14, wherein the PbSe semiconductor nanocrystals are capped with oleic acid ligands.

19. The upconversion system of claim 14, wherein the upconversion system is a multiphoton image, a data storage, an optical display, a lighting and solar energy conversion schemes, photovoltaics and/or solar fuel production.

* * * * *